US012685023B2

(12) United States Patent
Xu et al.

(10) Patent No.: US 12,685,023 B2
(45) Date of Patent: Jul. 14, 2026

(54) PREPARATION METHOD FOR PIEZOELECTRIC COMPOSITE MATERIAL, AND APPLICATION THEREOF

(71) Applicant: XI'AN JIAOTONG UNIVERSITY, Xi'an (CN)

(72) Inventors: Zhuo Xu, Xi'an (CN); Nanxiang Jia, Xi'an (CN); Ting Wang, Xi'an (CN); Peng Luan, Xi'an (CN); Hongliang Du, Xi'an (CN); Fei Li, Xi'an (CN); Song Xia, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 803 days.

(21) Appl. No.: 18/083,594

(22) Filed: Dec. 19, 2022

(65) Prior Publication Data

US 2023/0189651 A1      Jun. 15, 2023

Related U.S. Application Data

(63) Continuation of application No. PCT/CN2020/105379, filed on Jul. 29, 2020.

(30) Foreign Application Priority Data

Jun. 19, 2020      (CN) ......................... 202010568602.2

(51) Int. Cl.
*B33Y 10/00*           (2015.01)
*B29C 33/00*           (2006.01)
(Continued)

(52) U.S. Cl.
CPC ....... *H10N 30/084* (2023.02); *B29C 33/0022* (2013.01); *B29C 33/42* (2013.01);
(Continued)

(58) Field of Classification Search
None
See application file for complete search history.

(56) References Cited

U.S. PATENT DOCUMENTS

2008/0197754 A1      8/2008   Roux et al.
2014/0319734 A1 *   10/2014   Voit ..................... H04R 25/652
                                                                      264/129

FOREIGN PATENT DOCUMENTS

CN            103824934 A       5/2014
CN          106 098 928 A  *  11/2016
(Continued)

OTHER PUBLICATIONS

International Search Report dated Mar. 12, 2021 in International Application No. PCT/CN2020/105379. English translation attached. First Office Action from corresponding Chinese Application No. 202010568602.2, dated Apr. 27, 2020. English translation attached. The Grant Notice & Supplementary search from corresponding Chinese Application No. 202010568602.2, dated Nov. 1, 2021. English translation attached.

(Continued)

*Primary Examiner* — Mohammad M Ameen

(57) ABSTRACT

Provided are a preparation method of a piezoelectric composite material, and the application thereof. The preparation method includes: step 1, designing a curved-surface 3D printed mesh mold and forming the curved-surface 3D printed mesh mold by printing; step 2, cutting a blocky piezoelectric phase into a plurality of small piezoelectric columns; step 3, inserting the small piezoelectric columns into empty cells of the 3D printed mold; step 4, filling gaps between the piezoelectric columns and the 3D printed mold with a non-piezoelectric phase such as an epoxy resin, and curing and forming the non-piezoelectric phase; and step 5, grinding, polishing, and ultrasonically cleaning a prepared sample, and then performing an electrode coating operation on the sample to obtain a curved-surface piezoelectric composite material.

7 Claims, 3 Drawing Sheets

(51) Int. Cl.

| | |
|---|---|
| *B29C 33/42* | (2006.01) |
| *B33Y 80/00* | (2015.01) |
| *H10N 30/084* | (2023.01) |
| *H10N 30/088* | (2023.01) |
| *H10N 30/092* | (2023.01) |
| *B29K 101/10* | (2006.01) |
| *H10N 30/85* | (2023.01) |

(52) U.S. Cl.
CPC ............... *B33Y 10/00* (2014.12); *B33Y 80/00* (2014.12); *H10N 30/088* (2023.02); *H10N 30/092* (2023.02); *B29K 2101/10* (2013.01); *B29K 2995/0005* (2013.01); *H10N 30/852* (2023.02)

(56) References Cited

FOREIGN PATENT DOCUMENTS

| | | |
|---|---|---|
| CN | 107170882 A | 9/2017 |
| CN | 108400231 A | 8/2018 |
| CN | 108903975 A | 11/2018 |
| JP | 2001015822 A | 1/2001 |

OTHER PUBLICATIONS

Wang, Hongwei. 'Research of a High Frequency Broadband Underwater Acoustic Transducer', Chinese Journal of Sensors and Actuators), vol. 29, No. 5, May 31, 2016 (May 31, 2016).

* cited by examiner

Cutting into piezoelectric single crystal columns

Screening the piezoelectric single crystal columns

Printing to obtain a curved-surface 3D printed frame resin mold

Preparing an electrode

Pouring a resin

Inserting the piezoelectric single crystal columns into the mold

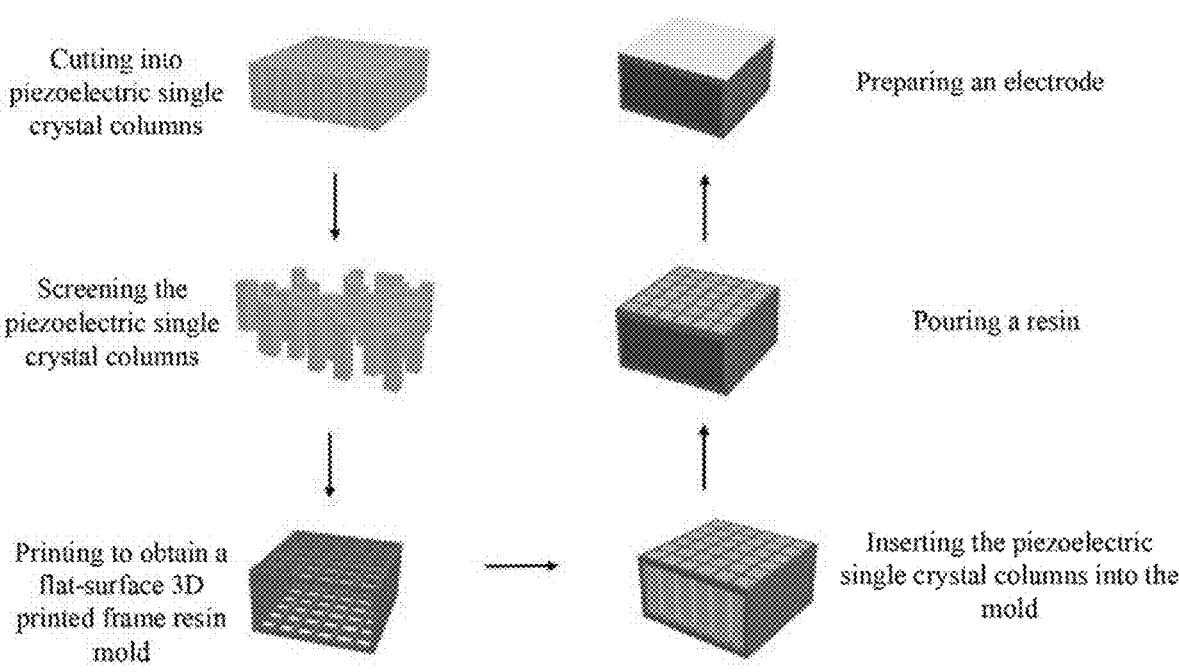

Cutting into piezoelectric single crystal columns

Screening the piezoelectric single crystal columns

Printing to obtain a flat-surface 3D printed frame resin mold

Inserting the piezoelectric single crystal columns into the mold

Pouring a resin

Preparing an electrode

FIG. 2

Cutting into piezoelectric ceramic columns

Printing to obtain a curved-surface 3D printed frame resin mold

Inserting the piezoelectric ceramic columns into the mold

Pouring a resin

Preparing an electrode

FIG. 3

Cutting into piezoelectric ceramic columns

Printing to obtain a flat-surface 3D printed frame resin mold

Inserting the piezoelectric ceramic columns into the mold

Pouring a resin

Preparing an electrode

PREPARATION METHOD FOR PIEZOELECTRIC COMPOSITE MATERIAL, AND APPLICATION THEREOF

CROSS-REFERENCE TO RELATED APPLICATIONS

The present application is a continuation of International Application No. PCT/CN2020/105379, filed on Jul. 29, 2020, which claims priority to Chinese Patent Application No. 202010568602.2, filed on Jun. 19, 2020, the entire contents of which are incorporated herein by their references.

FIELD

The present disclosure belongs to the field of piezoelectric material preparation technologies, and in particular, relates to a preparation method and use of a piezoelectric composite material.

BACKGROUND

A piezoelectric composite material combines a piezoelectric ceramic or a piezoelectric single crystal with a polymer in specific connectivity. In this way, compared with the original piezoelectric ceramic or piezoelectric single crystal, the piezoelectric composite material has advantages such as good flexibility, low acoustic impedance, high electromechanical coupling factor, and high underwater acoustic value of merit. Based on the above performance advantages, the piezoelectric composite material is widely used in underwater acoustic transducers, ultrasonic transducers, nondestructive testing, sensors, and other applications.

To meet the above different application needs, piezoelectric composite materials made of different materials and in different shapes are needed. The piezoelectric composite materials are classified into piezoelectric ceramic composite materials and piezoelectric single crystal composite materials based on materials and classified into flat-surface piezoelectric composite materials and curved-surface piezoelectric composite materials based on shapes.

Owing to low price and cost-effective performance of commercial ceramics such as Lead Zirconate Titanate (PZT), the piezoelectric ceramic composite material is widely used in commercial underwater acoustic transducers, commercial ultrasonic transducers, and other applications. Common preparation methods for a flat-surface type piezoelectric composite material include a cutting forming method and a casting forming method. Common preparation methods for a curved-surface type piezoelectric ceramic composite material include: (1) preparing a flat-surface piezoelectric composite material via a cutting-filling method, softening the flat-surface composite material by heating, and forming a curved surface using a mold; and (2) filling an epoxy resin in one cutting direction, filing (soft) rubber in a second cutting direction to form a flat-surface composite material, bending the composite material, and finally eroding away the rubber filled in the second direction and filling an epoxy resin material instead.

In recent years, with the rapid development of the piezoelectric single crystals, the piezoelectric single crystal composite material has gradually drawn attention of people and is therefore commercially applied. Compared with a conventional ceramic composite material, the piezoelectric single crystal composite material has great advantages in piezoelectric performance and electromechanical coupling performance. For example, a longitudinal piezoelectric coefficient $d33$ of the piezoelectric single crystal composite material is two to three times that of the ceramic composite material and a thickness electromechanical coupling coefficient $Kt$ thereof is enhanced by approximately 10% to 30%. A common preparation method for a flat-surface type piezoelectric single crystal composite material is a cutting-filling method. Common preparation methods for a curved-surface type piezoelectric single crystal composite material include: (1) preparing a flat-surface piezoelectric composite material via a cutting-filling method, softening the flat-surface composite material by heating, and forming a curved surface using a mold; and (2) filling an epoxy resin in one cutting direction, filing (soft) rubber in a second cutting direction to prepare a flat-surface composite material, bending the composite material, and finally eroding away the rubber filled in the second direction and fill an epoxy resin material instead.

The above preparation processes have different problems to be solved. For the curved-surface type piezoelectric composite material, the heating in the first method leads to depolarization of the piezoelectric single crystal composite material, which compromises performance of the piezoelectric single crystal composite material, and the second method is difficult in operation to prepare a curved-surface ceramic and piezoelectric composite material and is limited to bending in one direction. Also, both methods have problems such as low curve-surface controllability (inability to accurately control bending) and low yield. For the flat-surface type piezoelectric composite material, the common cutting-filling method can satisfy requirements of preparing a small-area piezoelectric single crystal composite material. However, limited by a growth size of a single crystal material itself and in-wafer uniformity, a large-area piezoelectric single crystal composite material can only be prepared by splicing small-area piezoelectric single crystal composite materials together, which degrades the electromechanical coupling coefficient, material consistency, etc.

SUMMARY

To solve the problems existing in the related art, the present disclosure provides a preparation method and use of a piezoelectric composite material, capable of realizing a simple and highly controllable preparation process that can produce a curved-surface piezoelectric composite material in batches.

To achieve the above objects, the present disclosure adopts a technical solution of a preparation method of a piezoelectric composite material. The method includes: step S1, obtaining a piezoelectric material block, and cutting the piezoelectric material block in a first direction, wherein the piezoelectric material block is made of a piezoelectric single crystal material or a piezoelectric ceramic material; step S2, cutting the piezoelectric material block that has been cut in the step S1 in a second direction to obtain a plurality of piezoelectric material columns independent from each other, wherein the second direction is perpendicular to the first direction; step S3, preparing a 3D printed resin mold; step S4, inserting the plurality of piezoelectric material columns obtained by the cutting in the step S2 into empty cells of the 3D printed resin mold obtained in the step S3, respectively, to obtain a combinant of the 3D printed resin mold and the piezoelectric material columns, wherein when the piezoelectric material block in the step S2 is made of the piezoelectric single crystal material, the plurality of piezoelectric material columns obtained by the cutting is screened before being inserted into the 3D printed resin mold obtained in the step S4; and step S5, pouring a resin material into the combinant of the resin mold and the piezoelectric material columns, curing the resin material, and performing surface grinding and polishing, to form a curved-surface piezoelectric composite material.

Each of the plurality of piezoelectric material columns obtained in step S2 has a square cross section.

In the step S3, the resin mold is of a type with a flat surface or of a type with a curved surface. The curved surface is an arc surface, a spherical surface, an ellipsoidal surface, or any irregular curved surface.

In the step S3, a resin used for preparing the 3D printed resin mold is a photosensitive resin or a thermosensitive resin.

In the step S3, the resin mold has a printing precision smaller than or equal to 0.25 mm.

In the step S4, crack-free single crystal piezoelectric material columns are retained during screening of single crystal piezoelectric material columns, and single crystal piezoelectric material columns having a piezoelectric coefficient falling within a designed range are loaded into a same mold.

In the step S5, the resin material to be poured is stirred in vacuum before being poured.

In the step S5, the resin material, when being poured, is poured from a same position into the combinant formed by the mold and the plurality of piezoelectric material columns.

Use of the piezoelectric composite material prepared by the method described in the present disclosure in obtaining a curved-surface piezoelectric composite material electrode includes: cleaning the curved-surface piezoelectric composite material, and then preparing a conductive layer on a surface of the curved-surface piezoelectric composite material.

The conductive layer is prepared on the surface of the curved-surface piezoelectric composite material by a low-temperature silver paste coating or rotating magnetron sputtering method.

Compared with the related art, the present disclosure can provide at least the following beneficial effects. Firstly, the problems in conventional processes for preparing piezoelectric single crystal composite materials, such as difficulty in preparing a large-area piezoelectric single crystal composite material and degraded performance, low controllability, and low yield in preparing a curved-surface piezoelectric single crystal composite material, are overcome. The present disclosure applies the 3D printing technology in the preparation of the piezoelectric composite material. Through designing curved-surface molds having different shapes and different bending angles, and rightly because the piezoelectric material block is cut off to form the plurality of piezoelectric material columns independent from each other, the shape of the mold can be designed as desired. In addition, the 3D printing technology can be used to realize preparation of molds in any shapes. Compared with the conventional preparation method for the piezoelectric single crystal composite material, a s simple process is provided and can improve controllability of a bending angle of a curved surface. Also, after the piezoelectric material block is cut into columns independent from each other, piezoelectric material columns having consistent performance can be selected to improve the overall performance, and the high-performance piezoelectric single crystal composite material can have significantly enhanced uniformity and is suitable for batch production.

BRIEF DESCRIPTION OF THE DRAWINGS

FIG. 2 is a schematic diagram of a preparation process of a flat-surface type piezoelectric single crystal composite material.

FIG. 3 is a schematic diagram of a preparation process of a curved-surface type piezoelectric ceramic composite material.

DETAILED DESCRIPTION

The present disclosure will be described in further detail below with reference to specific examples and accompanying drawings. The following examples are merely intended to illustrate, rather than limit, the present disclosure.

Example 1

Figure 1:
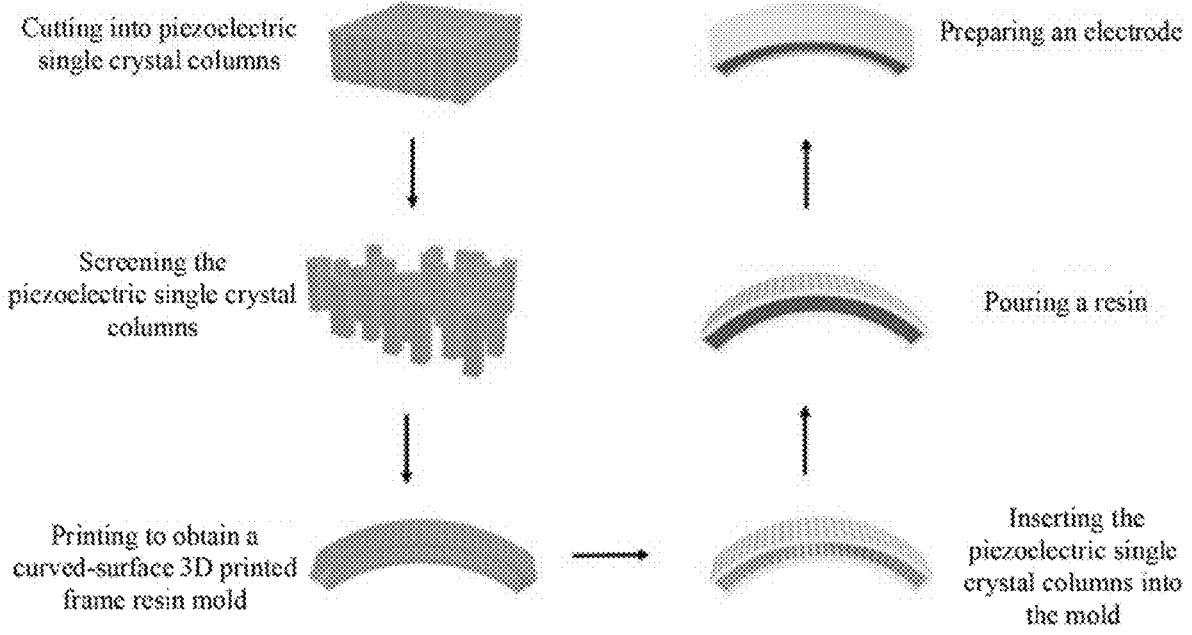
FIG. 1 is a schematic diagram of a preparation process of a curved-surface type piezoelectric single crystal composite material.

With reference to FIG. 1, this example adopted a preparation process with the following process flow: cutting to form piezoelectric single crystal columns, screening the piezoelectric single crystal columns, obtaining a curved-surface 3D printed frame resin mold by printing, inserting the piezoelectric single crystal columns into the mold, pouring a resin, and preparing an electrode.

In step S1, a piezoelectric single crystal block was obtained and cut in a first direction.

In step S2, the piezoelectric single crystal block that had been cut in the step S1 was cut in a second direction to obtain a plurality of piezoelectric single crystal columns independent from each other. The second direction is perpendicular to the first direction.

In step S3, the piezoelectric single crystal columns were screened.

In step S4, a curved-surface 3D printed frame resin mold having a bending angle of 140 degrees, a thickness of 5 mm, an area of 400 mm$^2$, and an empty cell size of 1 mm*1 mm*5 mm was prepared.

In step S5, the piezoelectric single crystal columns obtained by the screening in the step S3 were inserted into empty cells of the mold obtained in the step S4, respectively.

In step S6, a resin material was poured into a combinant of the curved-surface resin mold and the piezoelectric single crystal columns, and the resin was cured, to form a curved-surface piezoelectric single crystal composite material.

1) In the steps S1 and S2, the piezoelectric single crystal block was cut by a precise cutting machine to ensure integrity of the piezoelectric single crystal columns obtained by the cutting.

2) In the step S3, the piezoelectric single crystal columns were screened based on performance parameters such as a piezoelectric constant and a dielectric constant. For example, piezoelectric single crystal columns having d33 ranging from 1,800 pC/N to 2,000 pC/N were selected.

2) In the step S4, a 3D printer adopted to prepare the curved-surface 3D printed mold had an actual printing precision smaller than and equal to 0.25 mm.

3) In the step S5, when the piezoelectric single crystal columns were inserted into the empty cells, a gap was reserved between each of the piezoelectric single crystal columns and the mold. A soft adhesive paper having strong adsorbability was attached to a surface of the mold, or a cleaned support body was disposed on a lower surface of the mold, by which the piezoelectric single crystal columns were fixed in the empty cells of the mold without slipping off during insertion.

4) In the step S6, an epoxy resin was adopted as the resin to be poured. The resin was stirred evenly and then vacuumed in a vacuum box to remove air bubbles generated during stirring. In the pouring process, pouring the resin from a same position of the mold and slowing down the pouring can effectively reduce air bubbles generated in the pouring process to enable the resin to completely invade the gaps between the piezoelectric single crystal columns and the mold, allowing sufficient filtration of contact surfaces between the resin and the piezoelectric single crystal columns. When the epoxy resin was adopted as the resin to be poured, the epoxy resin was cured by standing still in vacuum for 24 hours.

For the curved-surface type piezoelectric single crystal composite material, an abrasive device having a corresponding curvature was preferably prepared to complete the grinding and polishing to avoid damages to an original design of curvature and bending angle of the composite material.

The composite material was cleaned with ethanol under ultrasonic vibration for 3 to 5 minutes before being prepared into an electrode. Since the prepared composite material had a curved surface, a uniform electrode layer cannot be obtained by a common flat-surface magnetron sputtering method. Instead, a curved-surface composite material electrode can be prepared by a low-temperature silver paste coating or rotating magnetron sputtering method.

In the preparation method of the curved-surface piezoelectric single crystal composite material provided by the present disclosure, the curved surface includes an arc surface, a spherical surface, an ellipsoidal surface, and any irregular curved surface.

Example 2, Preparation of a Flat-Surface Type Piezoelectric Single Crystal Composite Material With reference to FIG. 2, this example adopted a preparation process with the following process flow: cutting to form piezoelectric single crystal columns, screening the piezoelectric single crystal columns, obtaining a flat-surface 3D printed frame resin mold by printing, inserting the piezoelectric single crystal columns into the mold, pouring a resin, and preparing an electrode.

In step S1, a piezoelectric single crystal block was obtained and cut in a first direction.

In step S2, the piezoelectric single crystal block that had been cut in the step S1 was cut in a second direction to obtain a plurality of piezoelectric single crystal columns independent from each other. The second direction was perpendicular to the first direction.

In step S3, the piezoelectric single crystal columns were screened. The piezoelectric single crystal columns might be screened based on performance parameters such as a piezoelectric constant and a dielectric constant. For example, piezoelectric single crystal columns having d33 ranging from 1,800 pC/N to 2,000 pC/N were selected.

In step S4, a flat-surface 3D printed frame resin mold having a size of 100 mm*100 mm*5 mm (length*width*height) and an empty cell size of 1 mm*1 mm*5 mm was prepared. A 3D printer adopted to prepare the flat-surface 3D printed mold had an actual printing precision smaller than and equal to 0.25 mm.

In step S5, the piezoelectric single crystal columns obtained by the screening in the step S3 were inserted into empty cells of the mold obtained in the step S4, respectively. When the piezoelectric single crystal columns were inserted into the empty cells, a gap was reserved between each of the piezoelectric single crystal columns and the mold. Therefore, a soft adhesive paper having strong adsorbability was attached to a surface of the mold, or a cleaned support body was disposed on a lower surface of the mold, by which the piezoelectric single crystal columns were fixed in the empty cells of the mold without slipping off during insertion.

In step S6, a resin material was poured into a combinant of the flat-surface resin mold and the piezoelectric single crystal columns, and the resin was cured, to form a flat-surface piezoelectric single crystal composite material. An epoxy resin was adopted as the resin to be poured. The resin was stirred evenly and then vacuumed in a vacuum box to remove air bubbles generated during stirring. In the pouring process, pouring the resin from a same position of the mold and slowing down the pouring can effectively reduce air bubbles generated in the pouring process to enable the resin to completely invade the gaps between the piezoelectric single crystal columns and the mold, allowing sufficient infiltration of contact surfaces between the resin and the piezoelectric single crystal columns. When the epoxy resin was adopted as the resin to be poured, the epoxy resin was cured by standing still in vacuum for 24 hours.

In the steps S1 and S2, a piezoelectric ceramic block was cut by a precise cutting machine to ensure integrity of the piezoelectric single crystal columns obtained by the cutting.

The composite material was cleaned with ethanol under ultrasonic vibration for 3 to 5 minutes before being prepared into an electrode. A flat-surface composite material electrode was prepared by a magnetron sputtering or low-temperature silver paste coating or rotating magnetron sputtering method.

Example 3, Preparation of a Curved-Surface Type Piezoelectric Ceramic Composite Material With reference to FIG. 3, this example adopted a preparation process with the following process flow: cutting to form piezoelectric ceramic columns, obtaining a curved-surface 3D printed frame resin mold by printing, inserting the piezoelectric ceramic columns into the mold, pouring a resin, and preparing an electrode.

In step S1, a piezoelectric ceramic block was obtained and cut in a first direction.

In step S2, the piezoelectric ceramic block that had been cut in the step S1 was cut in a second direction to obtain a plurality of piezoelectric ceramic columns independent from each other. The second direction was perpendicular to the first direction.

In step S3, a curved-surface 3D printed frame resin mold having a bending angle of 140 degrees, a thickness of 5 mm, an area of 400 mm$^2$, and an empty cell size of 1 mm*1 mm*5 mm was prepared. A 3D printer adopted to prepare the curved-surface 3D printed mold had an actual printing precision smaller than and equal to 0.25 mm.

In step S4, the piezoelectric ceramic columns obtained by the cutting in the step S2 were inserted into empty cells of the mold obtained in the step S3, respectively. When the piezoelectric ceramic columns were inserted into the empty cells, a gap was reserved between each of the piezoelectric ceramic columns and the mold. Therefore, a soft adhesive paper having strong adsorbability was attached to a surface of the mold, or a cleaned support body was disposed on a lower surface of the mold, by which the piezoelectric material columns were fixed in the empty cells of the mold without slipping off during an insertion.

In the step S5, a resin material was poured or filled in a combinant of the curved-surface resin mold and the piezoelectric ceramic columns, and the resin was cured, to form a curved-surface piezoelectric ceramic composite material. When the resin to be poured was prepared in a formulation ratio (e.g., EPOK 301, 4:1), the resin was stirred evenly and then vacuumed in a vacuum box to remove air bubbles generated during stirring. In the pouring process, pouring the resin from a same position of the mold and slowing down the pouring can effectively reduce air bubbles generated in the pouring process to enable the resin to completely invade the gaps between the piezoelectric ceramic columns and the mold, allowing sufficient infiltration of contact surfaces between the resin and the piezoelectric ceramic columns. When an epoxy resin was adopted as the resin to be poured, the epoxy resin was cured by standing still for 24 hours.

In the steps S1 and S2, the piezoelectric ceramic block was cut by a precise cutting machine to ensure integrity of the piezoelectric ceramic columns obtained by the cutting.

Since the curved-surface type ceramic composite material was prepared in this example, an abrasive device having a corresponding curvature was preferably prepared to complete grinding and polishing to avoid damages to an original design of curvature and bending angle of the composite material.

The composite material was cleaned with ethanol under ultrasonic vibration for 3 to 5 minutes before being prepared into an electrode. Since the prepared composite material had a curved surface, a uniform electrode layer cannot be obtained by a common flat-surface magnetron sputtering method. Instead, a curved-surface composite material electrode can be prepared by a low-temperature silver paste coating or rotating magnetron sputtering method.

Figure 4:
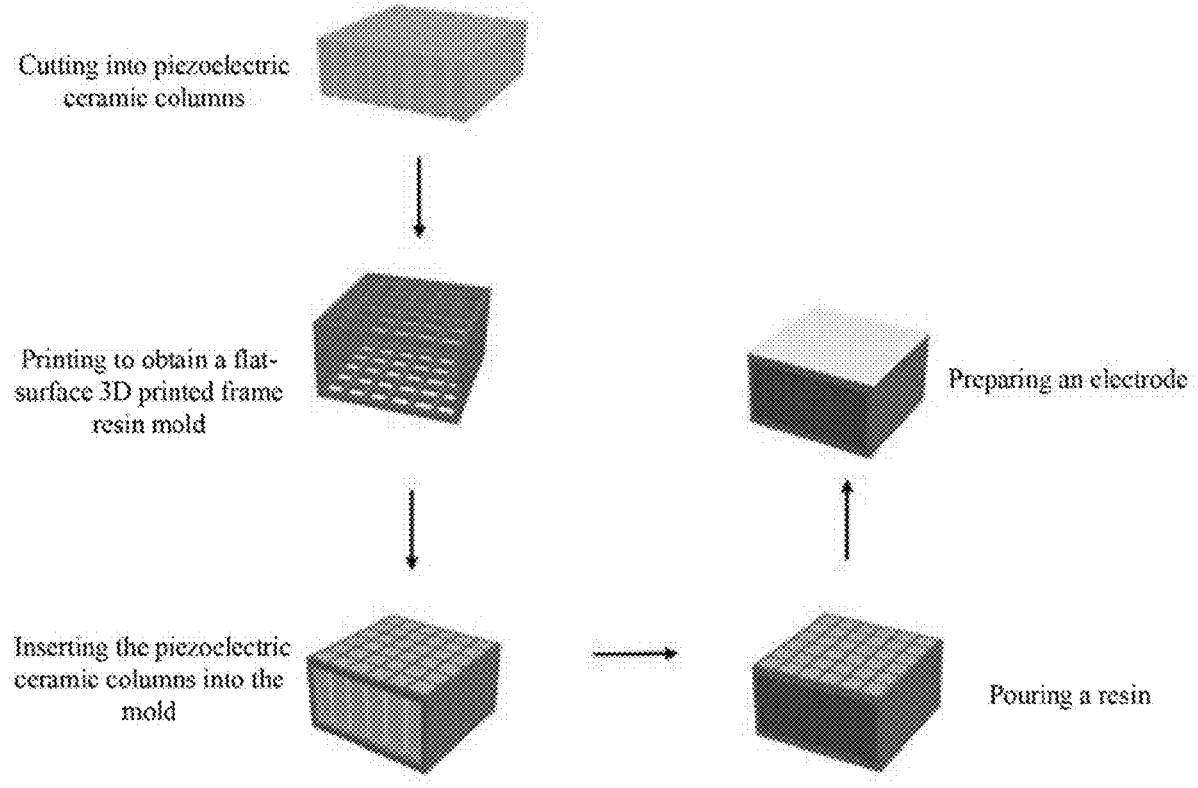
FIG. 4 is a schematic diagram of a preparation process of a flat-surface type piezoelectric ceramic composite material.

Example 4, Preparation of a Flat-Surface Type Piezoelectric Ceramic Composite Material With reference to FIG. 4, this example adopted a preparation process with the following process flow: cutting to form piezoelectric ceramic columns, obtaining a flat-surface 3D printed frame resin mold by printing, inserting the piezoelectric ceramic columns into the mold, pouring a resin, and preparing an electrode.

In step S1, a piezoelectric ceramic block was obtained and cut in a first direction.

In step S2, the piezoelectric ceramic block that had been cut in the step S1 was cut in a second direction to obtain a plurality of piezoelectric ceramic columns independent from each other. The second direction was perpendicular to the first direction.

In step S3, a flat-surface 3D printed frame resin mold having a size of 100 mm*100 mm*5 mm (length*width*height) and an empty cell size of 1 mm*1 mm*5 mm was prepared. A 3D printer adopted to prepare the flat-surface 3D printed mold had an actual printing precision smaller than and equal to 0.25 mm.

In step S4, the piezoelectric material columns obtained by the cutting in the step S2 were inserted into empty cells of the mold obtained in the step S3, respectively. When the piezoelectric ceramic columns were inserted into the empty cells, a gap was reserved between each of the piezoelectric ceramic columns and the mold. A soft adhesive paper having strong adsorbability was attached to a surface of the mold, or a cleaned support body was disposed on a lower surface of the mold, by which the piezoelectric material columns were fixed in the empty cells of the mold without slipping off during insertion.

In step S5, a resin material was poured or filled into a combinant of the flat-surface resin mold and the piezoelectric ceramic columns, and the resin was cured, to form a flat-surface piezoelectric ceramic composite material. An epoxy resin was adopted as the resin to be poured. The resin was stirred evenly and vacuumed in a vacuum box to remove air bubbles generated during stirring. In the pouring process, pouring the resin from a same position of the mold and slowing down the pouring can effectively reduce air bubbles generated in the pouring process to enable the resin to completely invade the gaps between the piezoelectric ceramic columns and the mold, allowing sufficient infiltration of contact surfaces between the resin and the piezoelectric ceramic columns. When the epoxy resin was adopted as the resin to be poured, the epoxy resin was cured by standing still in vacuum for 24 hours.

In the steps S1 and S2, the piezoelectric ceramic block was cut by a precise cutting machine to ensure integrity of the piezoelectric ceramic columns obtained by the cutting.

The composite material was cleaned with ethanol under ultrasonic vibration for 3 to 5 minutes before being prepared into an electrode. A flat-surface composite material electrode was prepared by a magnetron sputtering or low-temperature silver paste coating or rotating magnetron sputtering method.

Performance testing results of the curved-surface type piezoelectric single crystal composite material, the flat-surface type piezoelectric single crystal composite material, the curved-surface type piezoelectric ceramic composite material, and the flat-surface type piezoelectric ceramic composite material are shown in Table 1.

TABLE 1

| Performance | $\varepsilon_{33}{}^{T}$ ($\varepsilon_0$) | $d_{33}$ (pC/N) | $k_t$ | $\rho$ (kg/m$^3$) | $v^D$ (m/s) | Z (Mrayls) |
|---|---|---|---|---|---|---|
| Curved-surface piezoelectric single crystal composite material | 720 | 600 | 0.67 | 2970 | 3200 | 9.3 |
| Flat-surface piezoelectric single crystal composite material | 611 | 591 | 0.74 | 2870 | 3100 | 8.9 |
| Curved-surface piezoelectric ceramic composite material | 298 | 230 | 0.58 | 2695 | 3660 | 9.86 |
| Flat-surface piezoelectric ceramic composite material | 428 | 326 | 0.62 | 2795 | 3500 | 9.8 |

The above examples are merely used to explain rather than to limit the technical solutions of the present disclosure. Various modifications and equivalent alternatives of the technical solutions of the present disclosure can be made by those skilled in the art without departing from the ideas and scope of the present disclosure. The protection scope of the present disclosure shall be defined by the claims.

What is claimed is:

1. A preparation method of a piezoelectric composite material, comprising:

step S1, obtaining a piezoelectric material block, and cutting the piezoelectric material block in a first direction, wherein the piezoelectric material block is made of a piezoelectric single crystal material;

step S2, cutting the piezoelectric material block that has been cut in the step S1 in a second direction to obtain a plurality of piezoelectric material columns independent from each other, wherein the second direction is perpendicular to the first direction;

step S3, preparing a 3D printed resin mold comprising empty cells;

step S4, inserting the plurality of piezoelectric material columns obtained by the cutting in the step S2 into the empty cells of the 3D printed resin mold obtained in the step S3, respectively, to obtain a combinant of the 3D printed resin mold and the plurality of piezoelectric material columns, wherein the plurality of piezoelectric material columns obtained by the cutting is screened before being inserted into the 3D printed resin mold obtained in the step S3; crack-free single crystal piezoelectric material columns are retained during screening of single crystal piezoelectric material columns, and single crystal piezoelectric material columns having a piezoelectric coefficient falling within a designed range are loaded into a same mold; and step S5, pouring a resin material into the combinant of the resin mold and the plurality of piezoelectric material columns, curing the resin material, and performing surface grinding and polishing, to form a curved-surface piezoelectric composite material.

2. The preparation method of the piezoelectric composite material according to claim 1, wherein each of the plurality of piezoelectric material columns obtained in the step S2 has a square cross section.

3. The preparation method of the piezoelectric composite material according to claim 1, wherein in the step S3, the resin mold is of a type with a flat surface or of a type with a curved surface, wherein the curved surface is an arc surface, a spherical surface, an ellipsoidal surface, or any irregular curved surface.

4. The preparation method of the piezoelectric composite material according to claim 1, wherein in the step S3, a resin used for preparing the 3D printed resin mold is a photosensitive resin or a thermosensitive resin.

5. The preparation method of the piezoelectric composite material according to claim 1, wherein in the step S3, the resin mold has a printing precision smaller than or equal to 0.25 mm.

6. The preparation method of the piezoelectric composite material according to claim 1, wherein in the step S5, the resin material to be poured is stirred in vacuum before being poured.

7. The preparation method of the piezoelectric composite material according to claim 1, wherein in the step S5, the resin material, when being poured, is poured from a same position into the combinant formed by the mold and the plurality of piezoelectric material columns.

* * * * *